(12) United States Patent
Guo et al.

(10) Patent No.: US 9,059,291 B2
(45) Date of Patent: Jun. 16, 2015

(54) SEMICONDUCTOR-ON-INSULATOR DEVICE INCLUDING STAND-ALONE WELL IMPLANT TO PROVIDE JUNCTION BUTTING

(71) Applicant: International Business Machines Corporation, Armonk, NY (US)

(72) Inventors: Dechao Guo, Fishkill, NY (US); Wilfried E. Haensch, Somers, NY (US); Gan Wang, Fishkill, NY (US); Xin Wang, Beacon, NY (US); Yanfeng Wang, Fishkill, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/023,602

(22) Filed: Sep. 11, 2013

(65) Prior Publication Data

US 2015/0069513 A1    Mar. 12, 2015

(51) Int. Cl.
*H01L 27/01*    (2006.01)
*H01L 29/786*    (2006.01)
*H01L 29/78*    (2006.01)

(52) U.S. Cl.
CPC .......... *H01L 29/786* (2013.01); *H01L 29/7838* (2013.01)

(58) Field of Classification Search
CPC ............... H01L 27/1203; H01L 29/66772; H01L 29/78612; H01L 21/84; H01L 21/76264
USPC .................... 257/347–350, E29.233
See application file for complete search history.

(56) References Cited

U.S. PATENT DOCUMENTS

| | | | |
|---|---|---|---|
| 5,789,286 A | 8/1998 | Subbanna | |
| 5,843,816 A | 12/1998 | Liaw et al. | |
| 5,882,983 A | 3/1999 | Gardner et al. | |
| 6,313,510 B1 | 11/2001 | Kim et al. | |
| 7,314,804 B2 | 1/2008 | Lindert et al. | |
| 7,473,963 B2 * | 1/2009 | Kim et al. | 257/327 |
| 7,960,229 B2 | 6/2011 | Yang et al. | |
| 8,236,632 B2 | 8/2012 | Fried et al. | |
| 8,236,661 B2 | 8/2012 | Dennard et al. | |
| 2011/0291193 A1 | 12/2011 | Bryant et al. | |
| 2012/0146147 A1 | 6/2012 | Hook | |
| 2012/0161105 A1 * | 6/2012 | Rachmady et al. | 257/19 |

OTHER PUBLICATIONS

Hook et al., "Proximity Effects and VLSI Design", 2005 International Conference on Integrated Circuit Design and Technology, ICICDT, May 9-11, 2005, pp. 167-170.

* cited by examiner

*Primary Examiner* — Quoc Hoang
(74) *Attorney, Agent, or Firm* — Cantor Colburn LLP; Vazken Alexanian

(57) ABSTRACT

A semiconductor device includes a semiconductor-on-insulator (SOI) substrate having a bulk substrate layer, an active semiconductor layer, and a buried insulator layer interposed between the bulk substrate layer and the active semiconductor layer. A first source/drain (S/D) region includes a first stand-alone butting implant having a first butting width. A second S/D region includes a second stand-alone butting implant having a second butting width. A gate well-region is interposed between the first and second S/D regions. The gate well-region has a gate width that is greater than the first and second butting widths.

8 Claims, 12 Drawing Sheets

US 9,059,291 B2

SEMICONDUCTOR-ON-INSULATOR DEVICE INCLUDING STAND-ALONE WELL IMPLANT TO PROVIDE JUNCTION BUTTING

BACKGROUND

The present invention relates generally to semiconductor device manufacturing techniques and, more particularly, to forming butting implants in transistor devices to improving short channel effects (SCE), controlling parasitic capacitance, and reducing junction leakage.

Well doping is typically utilized to avoid source/drain punchthrough problems which may occur in transistors having channel lengths that are scaled below 40 nanometers (nm). In partially depleted semiconductor-on-insulator (PD-SOI) devices, for example, conventional methods have addressed junction leakage by forming doped wells beneath only the gate channel, and not the source/drain (S/D) regions. Alternatively, trench butting implants have been used to isolate gate well regions for reducing junction leakage and punchthrough.

Referring to FIGS. 1-3, a conventional semiconductor device 100 is illustrated. The conventional semiconductor device 100 includes a gate stack 102 formed on a substrate 104. According to the conventional process flow, S/D regions 106 are formed at opposing sides of a gate stack 102 using, for example, an etching process. The etching process results in wide exposed areas of the S/D region. After performing the etching process, ions are implanted in the etched S/D regions 106 to form the trench butting implant regions 108 illustrated in FIG. 3. Depositing the ions after recessing the S/D regions 106, however, creates non-uniform trench implants having increased widths (AO due to the wide exposed areas of the etched S/D regions. The increased widths of the trench butting implants reduce the width of the gate well region.

SUMMARY

According to at least one exemplary embodiment, a semiconductor device comprises a semiconductor-on-insulator (SOI) substrate including a bulk substrate layer, an active semiconductor layer, and a buried insulator layer interposed between the bulk substrate layer and the active semiconductor layer. Source/drain (S/D) regions include a stand-alone butting implant formed therein. The stand-alone butting implant has a first butting width.

According to another exemplary embodiment, a method of forming a semiconductor device including a semiconductor substrate comprises forming a masking layer on an active semiconductor layer of the semiconductor substrate. The method further comprises designating at least one source/drain (S/D) area of the semiconductor substrate, and patterning the masking layer to form a void at the S/D area. The method further includes depositing ions at the masking layer such that the ions are implanted into the active semiconductor layer via the void to form a respective stand-alone butting implant in the active semiconductor layer.

Additional features are realized through various exemplary embodiments described in the present disclosure. Other exemplary embodiments are described in detail herein and are considered a part of the claimed invention. For a better understanding of the various embodiments described herein, the following description and corresponding drawings are provided.

BRIEF DESCRIPTION OF THE SEVERAL VIEWS OF THE DRAWINGS

The subject matter of various exemplary embodiments of the invention is particularly pointed out and distinctly claimed in the claims at the conclusion of the specification. The forgoing and other features of the exemplary embodiments are apparent from the following detailed description taken in conjunction with the accompanying drawings.

FIGS. 1 through 3 are a series of cross-sectional views illustrating a conventional method of forming a trench implant after etching S/D regions of a semiconductor device, in which:

FIG. 1 illustrates a conventional semiconductor substrate having a gate stack formed thereon;

FIG. 2 illustrates an ion deposition process performed on the conventional semiconductor substrate of FIG. 1 following etching of the S/D regions; and FIG. 3 illustrates the conventional semiconductor device of FIG. 2 having trench implants formed in the etched S/D regions.

FIGS. 4 through 11 are a series of cross-sectional views illustrating a process of forming stand-alone well implants in semiconductor device according to an exemplary embodiment of the invention, in which:

FIG. 4 illustrates a cross-sectional view of a starting semiconductor-on-insulator (SOI) substrate according to an exemplary embodiment of the invention;

FIG. 5 illustrates a cross-sectional view of the SOI substrate shown in FIG. 4 following formation of a masking layer on an active semiconductor layer of the SOI substrate;

FIG. 6 illustrates a cross-sectional view of the SOI substrate shown in FIG. 5 after patterning the masking layer to form voids that expose the underlying active semiconductor layer;

FIG. 7 illustrates a cross-sectional view of the SOI substrate shown in FIG. 6 undergoing a butting ion implant deposition process to form stand-alone butting implants;

FIG. 8 illustrates a cross-sectional view of the SOI substrate shown in FIG. 7 including stand-alone butting implants formed at the portions of the active SOI layer according to the voids;

FIG. 9 illustrates a cross-sectional view of the SOI substrate shown in FIG. 8 following removal of the masking layer to expose a well-region interposed between the stand-alone butting implants;

FIG. 10 illustrates a cross-sectional view of the SOI substrate shown in FIG. 9 following formation of a gate stack on the well-region; and FIG. 11 illustrates a cross-sectional view of the SOI substrate shown in FIG. 10 following an etching process performed after forming the gate stack to recess the S/D regions.

DETAILED DESCRIPTION

Referring now to FIGS. 4 through 11, a series of cross-sectional views illustrate a process flow of forming a semiconductor device having one or more stand-alone well implants according to an exemplary embodiment. Unlike the conventional process that forms trench implants after the S/D regions are recessed, the process flow illustrated according to the exemplary embodiment of FIGS. 4 through 11 forms the stand-alone well implants at the S/D well-formation stage. That is, the stand-alone well implants are formed before recessing the S/D regions. As a result, the size and shape of the butting implant region, for example the butting implant width (AO may be independently controlled. For example, two different stand-alone butting implants (e.g., first and second butting implants) may be formed in a single device. The butting implants may be different with respect to one another in terms of energy, dose and/or species. Accordingly, asymmetrical source and drain regions may be formed. Moreover, the process flow according to at least one embodiment of the present invention provides a feature of controlling the dimensions of the stand-alone butting implant independently from the dimensions of the S/D regions.

Figure 4:
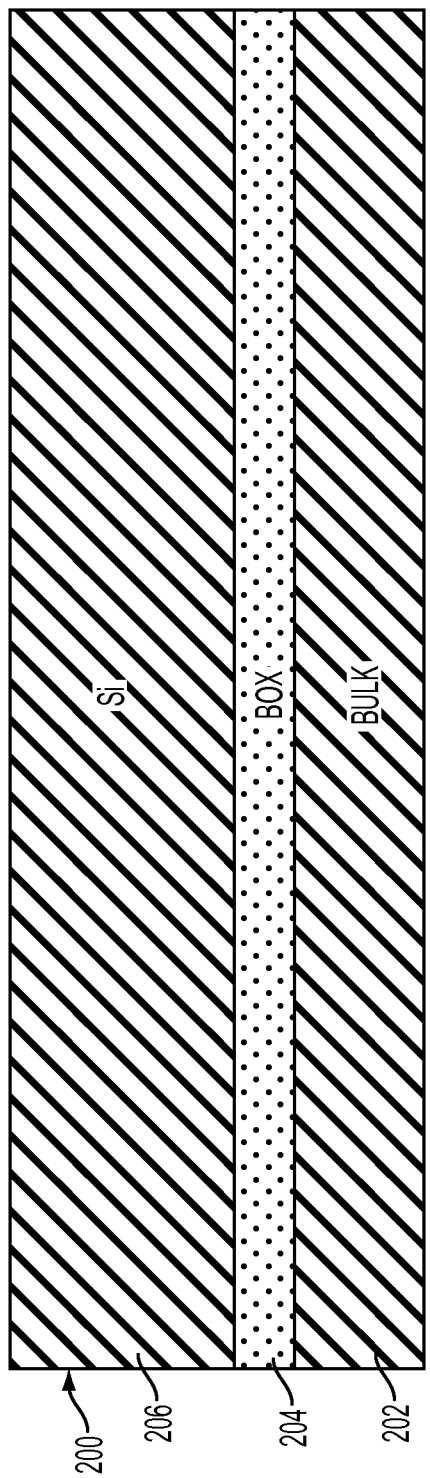

Referring to FIG. 4, a cross-sectional view of a starting SOI substrate 200 is illustrated. The starting SOI substrate 200 includes a bulk substrate layer 202 and a buried insulator layer 204 formed on an upper surface of the bulk substrate layer 202. The buried insulator layer 204 may include, for example, a buried oxide (BOX) layer 204. An active SOI layer 206 is formed on a surface of the BOX layer 204. Accordingly, the BOX layer 204 is interposed between the bulk substrate layer 202 and the active SOI layer 206. The BOX layer 204 may comprise an oxide material including, but not limited to, silicon oxide ($SiO_2$). The bulk substrate layer 202 may comprise a semiconductor material including, but not limited to, silicon (Si). The active SOI layer 206 may comprise an active semiconductor material including, but not limited to, Si, to form an active semiconductor layer.

Figure 1:
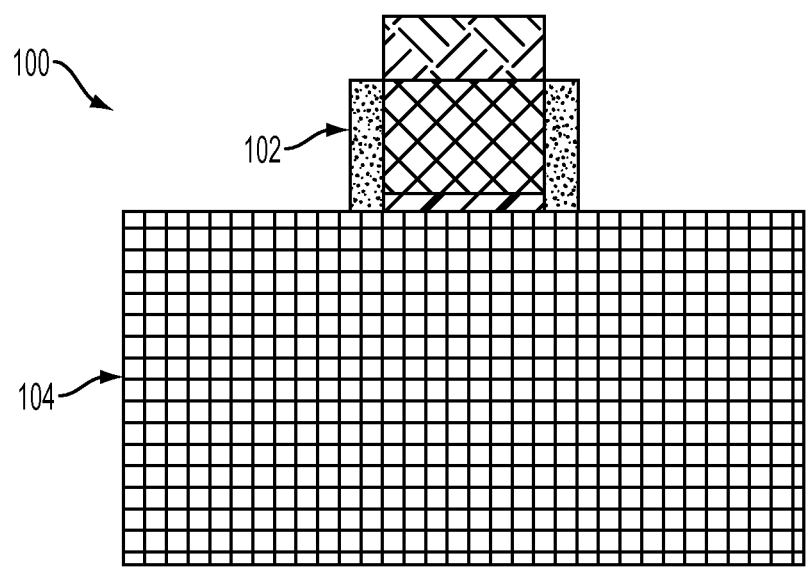
Figure 2:
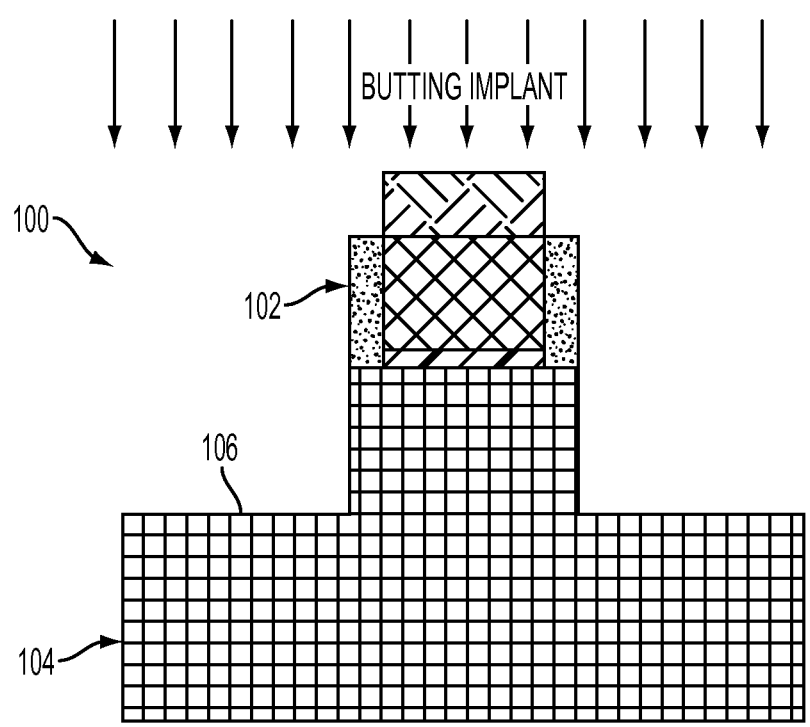
Figure 3:
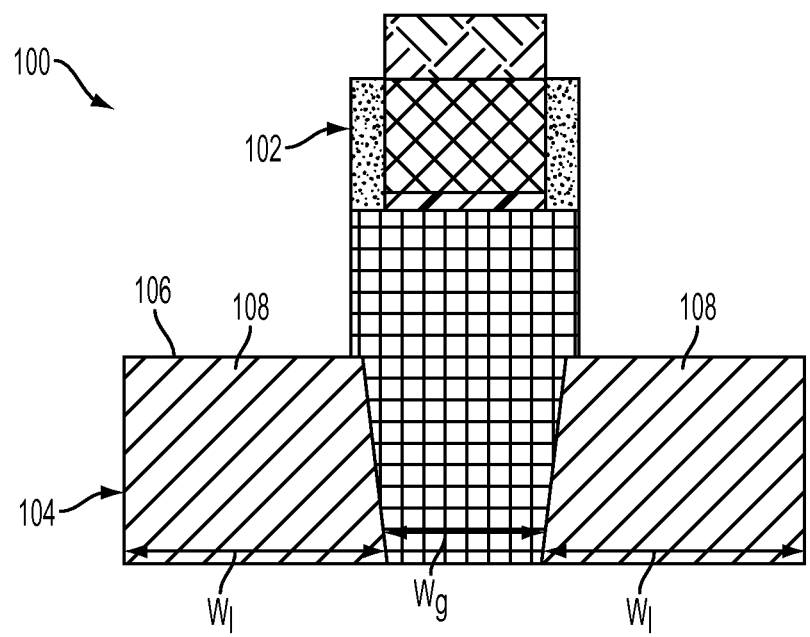

In at least one exemplary embodiment illustrated in FIG. 1, an NFET device may be formed by implanting p-type (e.g., boron) ions in the active SOI layer 206. That is, p-type ions may be implanted in the active SOI layer 206 to form a p-type active SOI layer, for example. It is appreciated that a PFET device may be formed in a similar manner by implanting n-type (e.g., arsenic) ions in the active SOI layer 206. For example, n-type ions may be implanted in the active SOI layer 206 to form an n-type active SOI layer. Alternatively, the active SOI layer 206 may be grown from an epitaxial material deposited on an exposed surface of the BOX layer 204 as understood by those ordinarily skilled in the art. The epitaxial material may be doped with boron, for example, to form a p-type active SOI layer, or arsenic, for example, to form an n-type active SOI layer.

Figure 5:
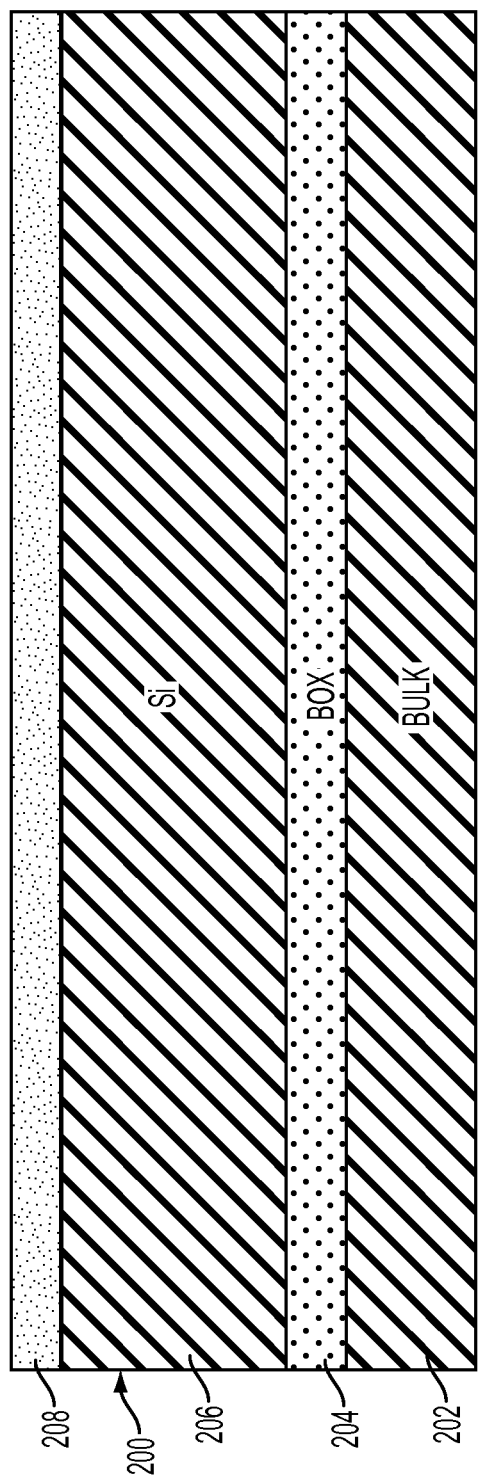

Referring now to FIG. 5, a masking layer 208 is formed on a surface of the active SOI layer 206. The masking layer 208 may be formed from various materials that block doping ions from reaching the active SOI layer 206. In at least one embodiment, the masking layer 208 is formed from, for example, silicon nitride.

Figure 6:
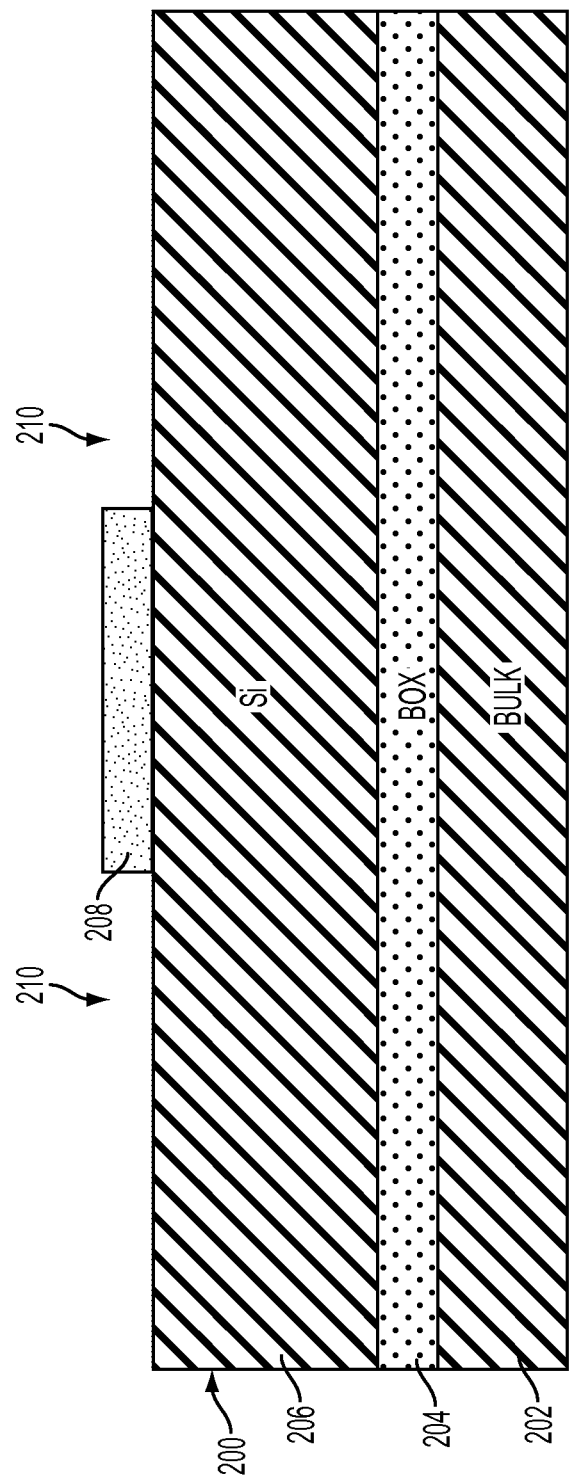

Turning now to FIG. 6, the masking layer 208 is patterned to form one or more voids 210 that expose the underlying active SOI layer 206. Various patterning methods may be used including, but not limited to, photo lithography. In at least one exemplary embodiment, the voids are located at designated S/D regions of the SOI substrate.

Figure 7:
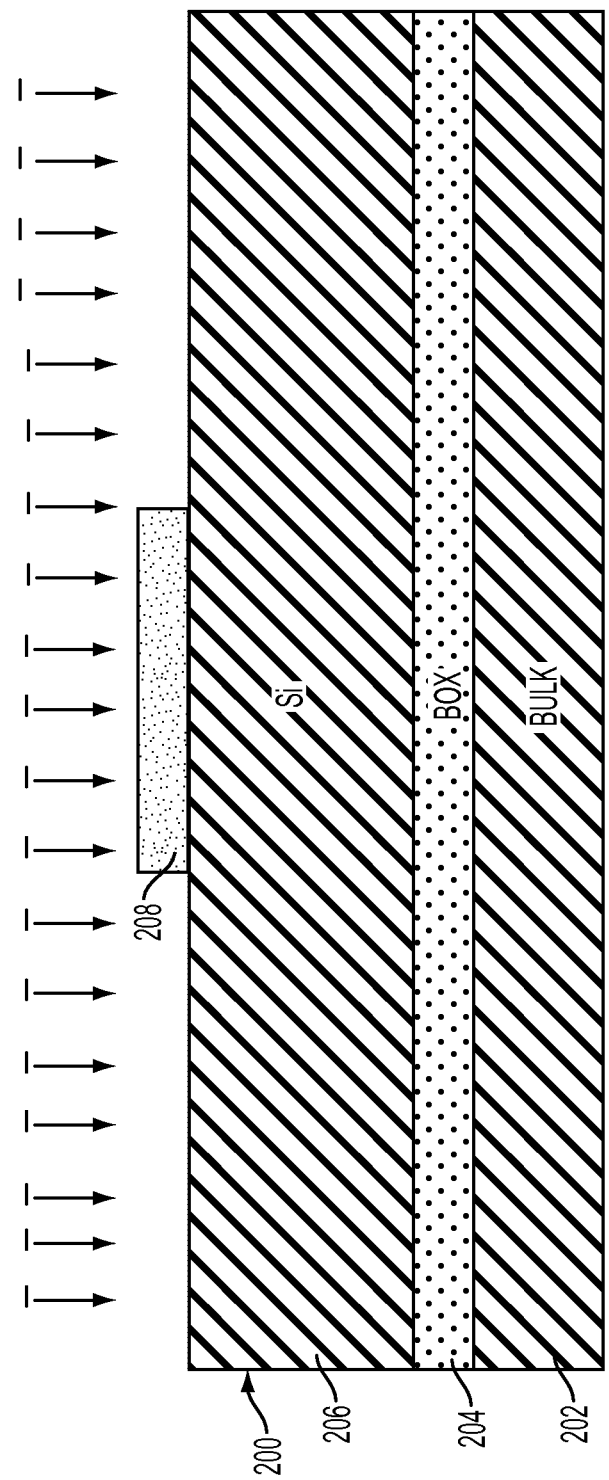

Referring now to FIG. 7, a butting ion implant deposition process is applied to the SOI layer 206. The remaining portions of the masking layer 208 are configured to block the butting implant ions from reaching the active SOI layer 206. However, the butting implant ions are received by portions of the active SOI layer 206 exposed by the voids 210. The butting implant ions may be selected based on the doping of the active SOI layer 206. If the active SOI layer 206 is a p-type active SOI layer, then n-type butting implant ions may be deposited. However, if the active SOI layer 206 is an n-type active SOI layer, then p-type butting implant ions may be deposited.

Figure 8:
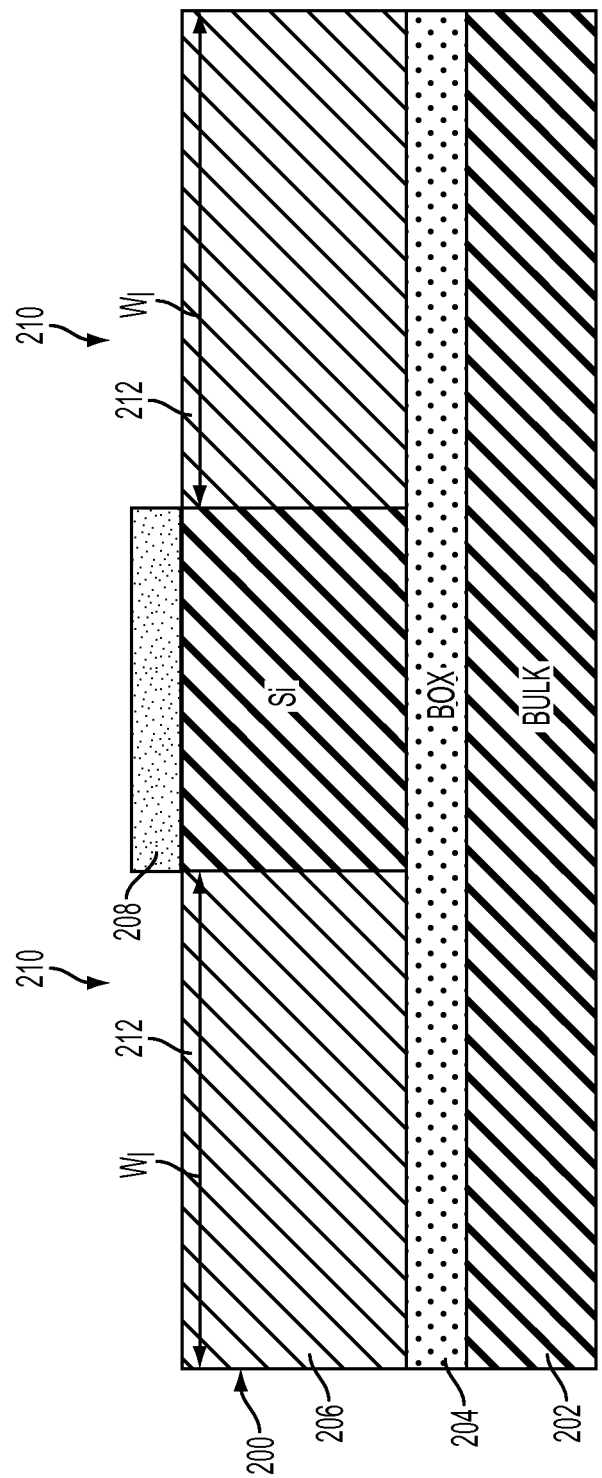

Following the deposition of the butting implant ions, stand-alone butting implants 212 are formed in the portions of the active SOI layer 206 exposed by the voids 210 as illustrated in FIG. 8. The stand-alone butting implants 212 are either p-type stand-alone butting implants or n-type stand-alone butting implants based on the doping of the butting implant ions as discussed above. The dimensions of the stand-alone butting implants 212, for example the butting implant width (AO, may be controlled by the width of the voids 210. Accordingly, the uniformity of the stand-alone butting implants 212 may be improved.

Figure 9:
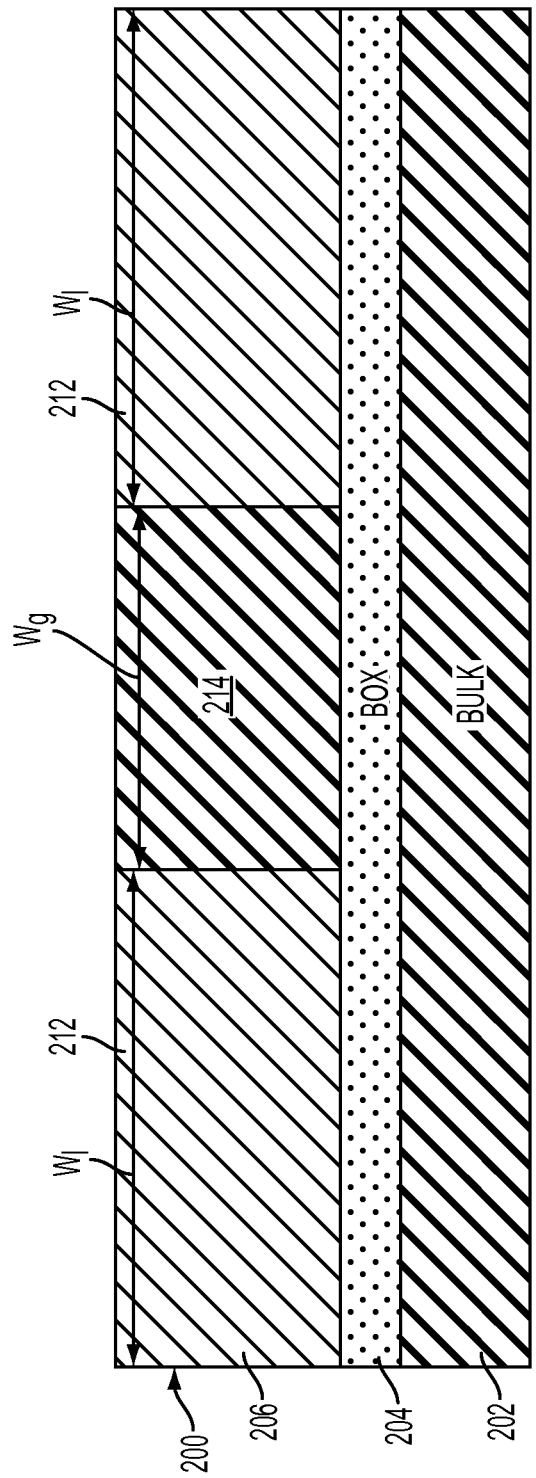

Referring to FIG. 9, the masking layer 208 may be removed to expose a well-region 214 (e.g., a doped gate well-region) interposed between the stand-alone butting implants 212. Accordingly, the stand-alone butting implants 212, along with the BOX layer 204, electrically isolate the well-region 214. Further, since the $w_I$ of the stand-alone butting implants 212 may be controlled by the width of the voids 210, a gate width ($w_g$) of the well-region may ultimately be controlled and an increased $w_g$ (e.g., increased $w_g$ with respect to $w_I$) may be maintained.

Figure 10:
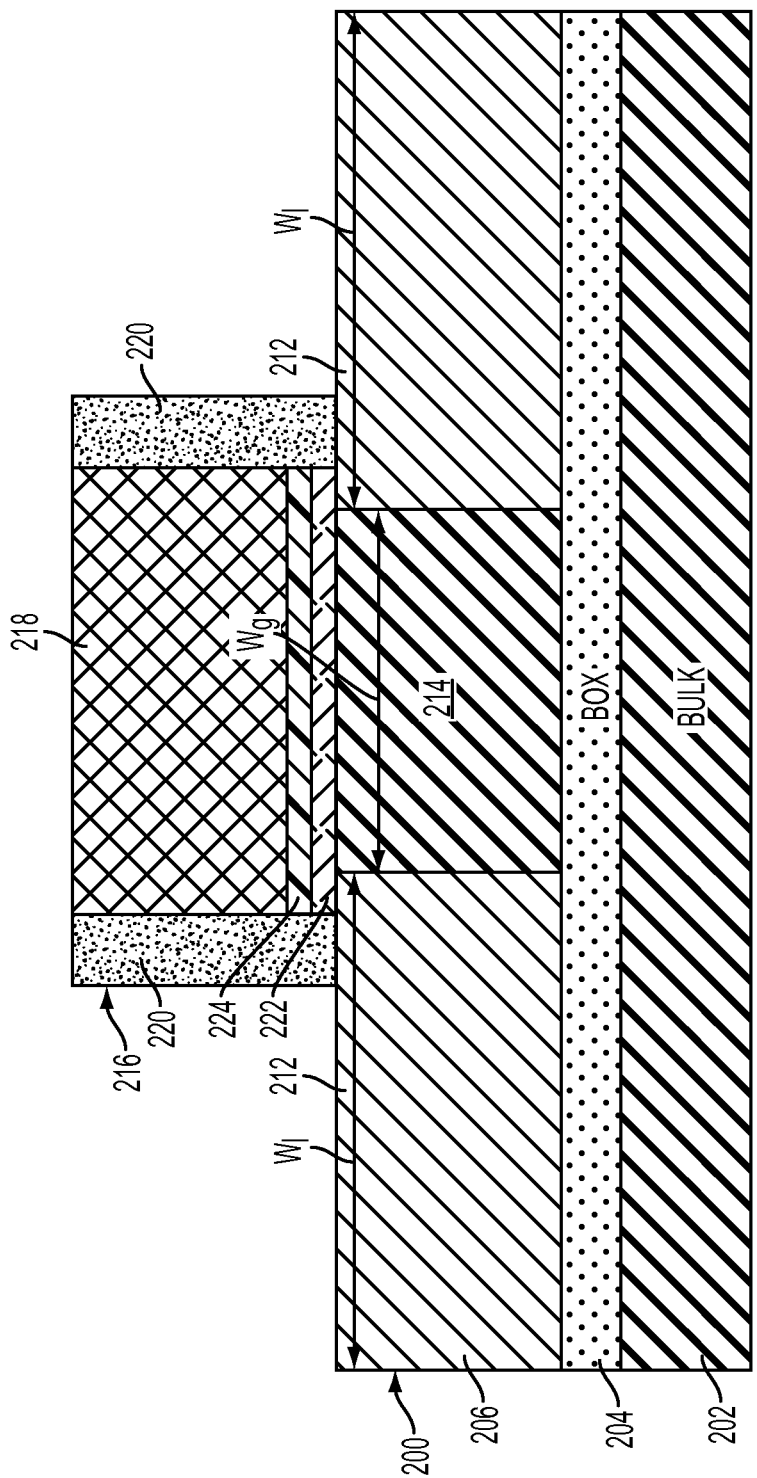

Turning to FIG. 10, a gate stack 216 may be formed on the well-region 214. Various methods known to those ordinarily skilled in the art may be used to form the gate stack 216. The gate stack 216 may include a gate layer 218, and spacers 220 formed on sides of the gate layer 218 when recessing S/D regions 226 as discussed in greater detail below. The gate layer 218 may be formed from, for example, a polysilicon material. The spacers 220 may be formed from a nitride material to protect the gate layer 218. In at least one embodiment, the gate stack 216 further includes a gate oxide layer 222 and a high dielectric (high-k) layer 224 to isolate the gate stack 216 from the doped gate well region 214. The gate oxide layer 222 may comprise an oxide material (e.g., $SiO_2$) and is formed on the surface of the doped well-region 214. The high-k layer 224 may be formed as a high-k metal (e.g., silicon germanium) and is interposed between the gate oxide layer 222 and the gate layer 218.

In at least one embodiment, each of the stand-alone butting implants 212 extends beneath a respective spacer 220. The stand-alone butting implants 212 may further overlap the gate stack 216 such that the stand-alone butting implants 212 extend beyond the spacers 220 and beneath the gate layer 218 as further illustrated in FIG. 10.

Figure 11:
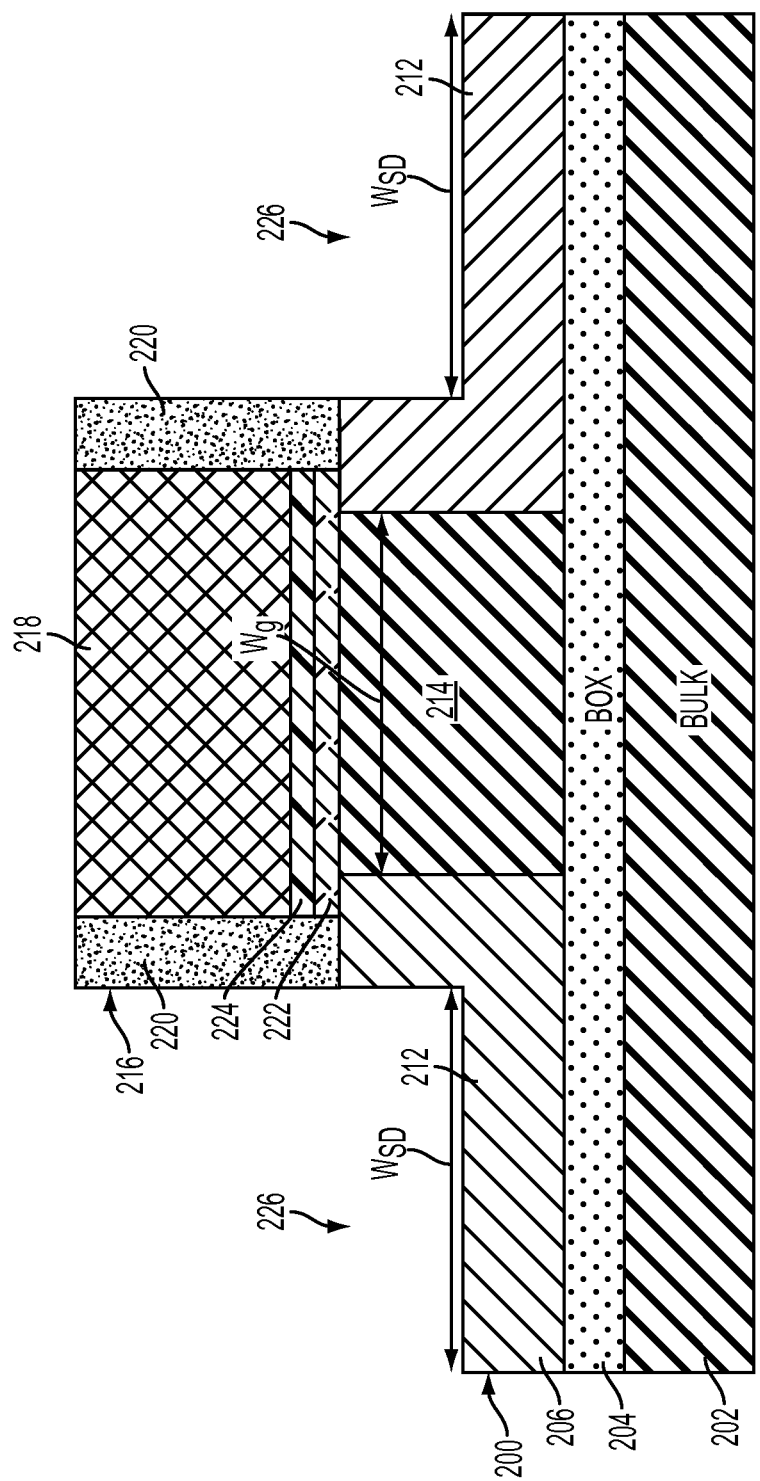

Referring now to FIG. 11, portions of the SOI substrate 200 adjacent each spacer 220 are recessed to form respective S/D regions 226. Various etching methods known by those ordinarily skilled in the art may be used to form the S/D regions. Accordingly, by forming the stand-alone butting implants 212 prior to recessing the S/D regions 226, the size and/or shape of the stand-alone butting implants 212, for example the butting implant width ($w_I$), may be controlled. In at least one exemplary embodiment, the maximum $w_I$ of each stand-alone butting implant 212 is less than a maximum width ($w_{SD}$) of the S/D region 226.

Moreover, the dimensions of the stand-alone butting implant 212 may be controlled independently from the dimensions of the S/D regions 226. Further, by controlling the dimensions of the stand-alone butting implants 212 (e.g., $w_I$), an increased width ($w_g$) of the well-region 214 may be maintained. That is, unlike the conventional method of forming trench butting implants after etching the S/D regions, which decreases the width of the well-region beneath the gate stack 216, the stand-alone butting implants 212 of the present invention maintains an increased distance of the well-region 214. Accordingly, current leakage through the well-region 214 may be reduced.

In at least one exemplary embodiment, the gate well-region has a width ($w_g$) that is greater than the stand-alone butting widths ($w_I$). For example, $w_g$ located at a junction between the active SOI layer 206 and the BOX layer 204 is greater than $w_I$ of the stand-alone butting implants 212 located at the junction. Therefore, the increased width ($w_g$) of the well-region 214 reduces the occurrence of current leakage between the stand-alone butting implants 212, and improves the isolation of the well-region 214.

In another exemplary embodiment, the locations of the gate stack 216 and stand-alone butting implants 212 may be independently controlled. For example, a maximum butting width of a stand-alone butting implant 212 may be less than a maximum width of a respective S/D region. That is, $w_I$ may be narrower and not overlapped with the spacer 220. Accordingly, the deep-well leakage between source and drain may be reduced.

Figure 12:
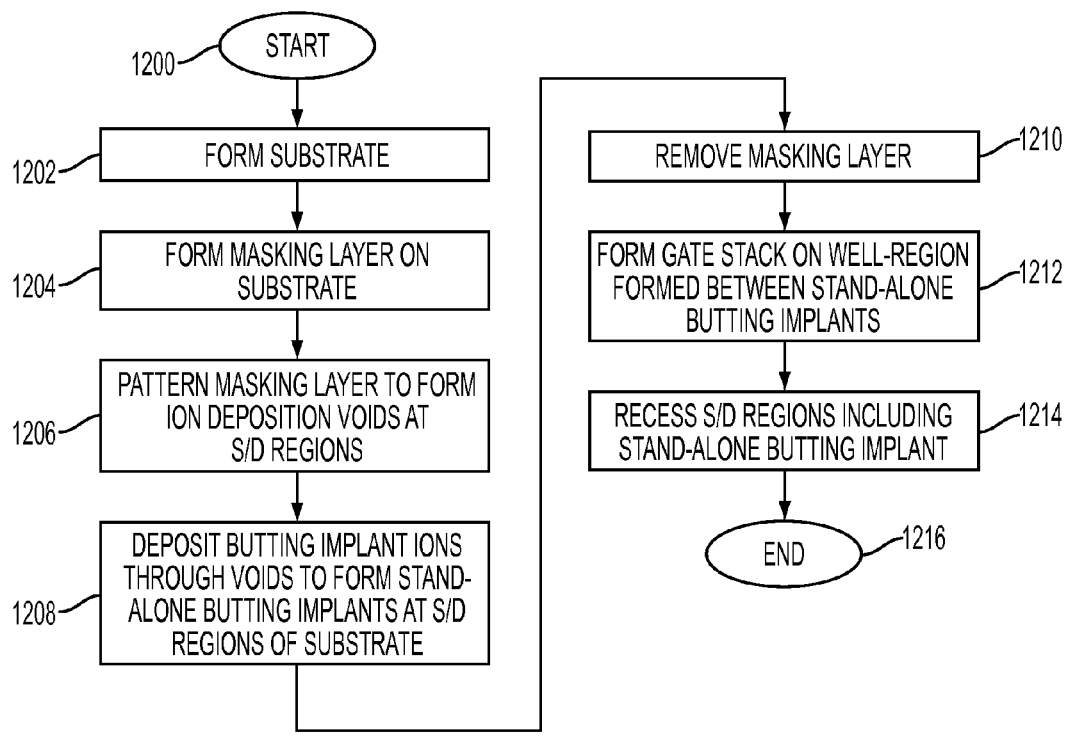
FIG. 12 is a flow diagram illustrating a method of forming one or more stand-alone well implants in a semiconductor device according to an exemplary embodiment.

Turning to FIG. 12, a flow diagram illustrates a method of forming one or more stand-alone well implants in a semiconductor device according to an exemplary embodiment. The method begins at operation 1200 and proceeds to operation 1202 where a starting substrate is formed. In at least one exemplary embodiment, the starting substrate is an SOI substrate as understood by those ordinarily skilled in the art. In at least one exemplary embodiment, the SOI substrate includes a bulk substrate layer, a BOX layer formed on the bulk substrate layer, and an active semiconductor layer formed on the BOX layer. At operation 1204, a masking layer is formed on a surface of the substrate. At operation 1206, the masking layer is patterned to form a void at a respective S/D region corresponding to the substrate. The voids expose the underlying active semiconductor layer of the SOI substrate. At operation 1208, butting implant ions are deposited at the masking layer. The butting implant ions may be p-type ions or n-type ions. The unpatterned portions of the masking layer block the ions from traveling therethrough, while the voids allow the ions to be implanted into the substrate. Accordingly, stand-alone butting implants are formed in the substrate such that the dimensions of the stand-alone butting implants may be controlled by the dimensions of a respective void. At operation 1210, the masking layer is removed. A gate stack is formed on a well region of the SOI substrate at operation 1212. In at least one exemplary embodiment, the well-region is interposed between a pair of stand-alone butting implants. At operation 1214, the S/D regions including the stand-alone butting implant are recessed, and the method ends at operation 1216.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While various exemplary embodiments are described, it will be understood that those skilled in the art, both now and in the future, may make various modifications which fall within the scope of the claims which follow. These claims should be construed to maintain the proper protection of the invention first described.

What is claimed is:

1. A semiconductor device, comprising:
   a semiconductor-on-insulator (SOI) substrate including a bulk substrate layer, an active semiconductor layer, and a buried insulator layer interposed between the bulk substrate layer and the active semiconductor layer;
   a first source/drain (S/D) region including a first stand-alone butting implant formed therein and directly on the buried insulator layer, the first stand-alone butting implant having a first butting width;
   a second S/D region including a second stand-alone butting implant formed therein and directly on the buried insulator layer, the second stand-alone butting implant having a second butting width; and
   a gate well-region interposed between the first and second S/D regions such that the first and second stand-alone butting implants are directly against the gate well-region, the gate well-region having a gate width that is greater than the first and second butting widths.

2. The semiconductor device of claim 1, wherein the gate width located at a junction between the active semiconductor layer and the buried insulator layer is greater than the first and second butting widths located at the junction.

3. The semiconductor device of claim 2, wherein a maximum butting width of a stand-alone butting implant is less than a maximum width of a respective S/D region.

4. The semiconductor device of claim 3, wherein a gate stack is formed on the gate well-region, the gate stack including a gate layer and a spacer formed on respective opposing sides of the gate layer.

5. The semiconductor device of claim 4, wherein the first and second stand-alone butting implants extend beneath the gate stack.

6. The semiconductor device of claim 5, wherein the first and second stand-alone butting implants overlap the gate stack and extend beneath the gate layer.

7. The semiconductor device of claim 6, wherein the gate well-region is doped with p-type ions and the first and second stand-alone butting implants are doped with n-type ions.

8. The semiconductor device of claim 6, wherein the gate well-region is doped with n-type ions and the first and second stand-alone butting implants are doped with p-type ions.

* * * * *